(12) United States Patent
Choi

(10) Patent No.: US 7,948,794 B2
(45) Date of Patent: May 24, 2011

(54) NONVOLATILE MEMORY DEVICE USING VARIABLE RESISTIVE ELEMENT

(75) Inventor: Byung-Gil Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 92 days.

(21) Appl. No.: 12/478,896

(22) Filed: Jun. 5, 2009

(65) Prior Publication Data
US 2009/0310403 A1    Dec. 17, 2009

(30) Foreign Application Priority Data
Jun. 17, 2008  (KR) ............................. 20080057042

(51) Int. Cl.
*G11C 11/00* (2006.01)
(52) U.S. Cl. .................................. 365/163; 365/230.06
(58) Field of Classification Search .................. 365/163, 365/230.06
See application file for complete search history.

(56) References Cited

U.S. PATENT DOCUMENTS

| | | | |
|---|---|---|---|
| 5,966,340 A * | 10/1999 | Fujino et al. | 365/230.03 |
| 6,088,286 A * | 7/2000 | Yamauchi et al. | 365/230.06 |
| 6,317,380 B1 | 11/2001 | Kang | |
| 6,538,953 B2 * | 3/2003 | Hidaka | 365/230.03 |
| 6,608,772 B2 * | 8/2003 | Ooishi | 365/63 |
| 7,221,579 B2 * | 5/2007 | Krusin-Elbaum et al. | 365/148 |
| 7,474,556 B2 | 1/2009 | Choi et al. | |
| 2006/0209616 A1 | 9/2006 | Kim et al. | |
| 2006/0279978 A1 * | 12/2006 | Krusin-Elbaum et al. | 365/148 |
| 2007/0206409 A1 | 9/2007 | Choi et al. | |
| 2008/0026535 A1 * | 1/2008 | Yang et al. | 438/335 |

FOREIGN PATENT DOCUMENTS

| | | |
|---|---|---|
| JP | 09045870 | 2/1997 |
| KR | 1020000043180 A | 7/2000 |
| KR | 1020010017947 A | 3/2001 |
| KR | 1020070090673 A | 9/2007 |

* cited by examiner

Primary Examiner — Michael T Tran
(74) Attorney, Agent, or Firm — Volentine & Whitt, P.L.L.C.

(57) ABSTRACT

A nonvolatile memory device includes multiple memory blocks divided into multiple memory block groups. Each memory block group includes at least two memory blocks of the multiple memory blocks. The nonvolatile memory device also includes a main word line common to the memory blocks, and multiple sub-word lines corresponding to the memory blocks. Sub-word lines of the multiple sub-word lines located within the same memory block group are electrically connected to each other, and sub-word lines of the multiple sub-word lines located in different memory block are electrically isolated from each other.

13 Claims, 6 Drawing Sheets

NONVOLATILE MEMORY DEVICE USING VARIABLE RESISTIVE ELEMENT

PRIORITY STATEMENT

A claim of priority is made to Korean Patent Application No. 10-2008-0057042, filed on Jun. 17, 2008, in the Korean Intellectual Property Office, the subject matter of which is hereby incorporated by reference.

SUMMARY

Nonvolatile memory devices, such as random access memory (RAM), using resistance materials include phase change RAM (PRAM), resistive RAM (RRAM), and magnetic RAM (MRAM), for example. Dynamic RAM (DRAM) and flash memory devices store data using charge. Nonvolatile memory devices using resistance materials store data using phase change of phase-change materials (e.g., PRAM), such as chalcogenide alloy, the resistance change of variable resistive elements (e.g., PRAM), and the resistance change of magnetic tunnel junction (MTJ) thin films according to the magnetization state of a ferromagnetic substance.

Using a phase change memory cell as an example, the phase-change material changes into a crystal state or amorphous state by cooling after heating. Since the phase-change material in the crystal state has a low resistance and the phase-change material in the amorphous status has a high resistance, the crystal state is defined as set data 0 and the amorphous state is defined as reset data 1.

Embodiments of the present invention relate to a nonvolatile memory device using variable resistive elements and enhanced performance. The aspects, features and advantages of the various embodiments are not restricted, and will become apparent to one of ordinary skill in the art with reference to the following description.

According to an aspect of the present invention, there is provided a nonvolatile memory device including multiple memory blocks divided into multiple memory block groups. Each memory block group includes at least two memory blocks of the multiple memory blocks. The nonvolatile memory device also includes a main word line common to the memory blocks, and multiple sub-word lines corresponding to the memory blocks. Sub-word lines of the multiple sub-word lines located within the same memory block group are electrically connected to each other, and sub-word lines of the multiple sub-word lines located in different memory block are electrically isolated from each other.

According to another aspect of the present invention, there is provided a nonvolatile memory device, including multiple memory blocks divided into multiple memory block groups, a main word line, multiple sub-word lines, and first and second sub-word line drivers. Each memory block group includes at least two memory blocks of the multiple memory blocks. The main word line is commonly located in the multiple memory blocks, and the sub-word lines respectively correspond to the multiple memory blocks. The first sub-word line driver drives a first sub-word line of the sub-word lines, and the second sub-word line driver, different from the first sub-word line driver, drives a second sub-word line of sub-word lines. The first and second sub-word line drivers are respectively located on each side of at least one memory block of the multiple memory blocks. Also, sub-word lines located within the same memory block group are electrically connected to each other, and sub-word lines not located in the same memory block group are electrically isolated from each other.

The first sub-word line driver includes a pull-down device, which pulls down a level of the first sub-word line in response to a signal applied to the main word line, and does not include a pull-up device. The second sub-word line driver includes a pull-up device, which pulls up a level of the second sub-word line in response to the signal applied to the main word line, and a pull-down device, which pulls down the level of the second sub-word line in response to the signal applied to the main word line.

BRIEF DESCRIPTION OF THE DRAWINGS

The embodiments of the present invention will be described with reference to the attached drawings, in which.

DETAILED DESCRIPTION OF THE EMBODIMENTS

Figure 1:
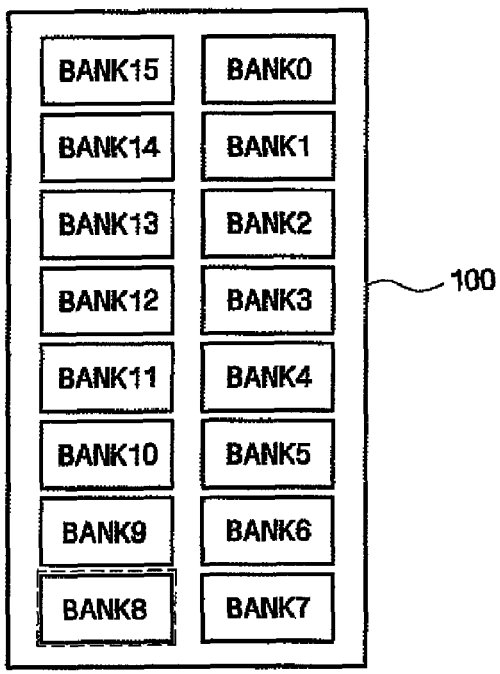
FIG. 1 is a block diagram illustrating a nonvolatile memory device, according to exemplary embodiments of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element component, region, layer or section from another element, component, region, layer or section. Thus, a first element component region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, although exemplary embodiments of the present invention will be described as using a phase change random access memory PRAM, it would be apparent to those skilled in the art that the descriptions can be applied in various embodiments to other kinds of nonvolatile memory devices using resistive elements, such as resistive RAM (RRAM) and ferroelectric RAM (FRAM), for example.

Figure 2:
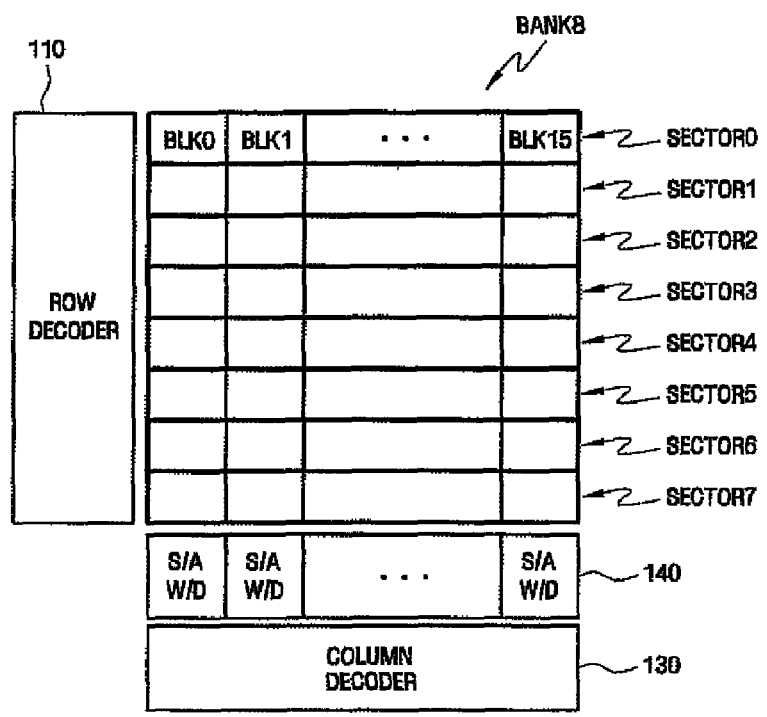
FIG. 2 is a block diagram illustrating a nonvolatile memory device, according to exemplary embodiments of the present invention.

FIGS. 1 and 2 are block diagrams illustrating a nonvolatile memory device, according to exemplary embodiments of the present invention.

Referring to FIGS. 1 and 2, a nonvolatile memory device 100 includes multiple memory banks BANKi (where i=0 to 15), a row decoder 110, a column decoder 130, and an I/O circuit 140. Although FIG. 1 shows 16 banks (BANKi: i=0-15), it is understood that the number of banks is representative, and that the various embodiments of the invention are not limited to this number. Likewise, although FIG. 2 specifically shows BANK8 of the multiple memory banks (BANKi: i=0-15) having seven sectors, it is understood that the number of sectors is representative, and that the various embodiments of the invention are not limited to this number. Further, BANK8 is an example used for description purposes only, and the description of BANK8 applies to the other memory banks BANK0-BANK15, as well.

Each of the multiple memory banks (BANKi: i=0-15) includes multiple nonvolatile memory cells arranged in a matrix. The memory banks (BANKi: i=0-15) may be structured in a hierarchy, for example. As illustrated in FIG. 2, each of memory banks (BANKi: i=0-15) may include multiple memory sectors (SECTORj: j=0-7), and each of the memory sectors (SECTORj: j=0-7) may include multiple memory blocks (BLKk: k=0-15).

The row decoder 110 specifies a row address of the memory bank (BANKi: i=0-15) and the column decoder 130 specifies a column address of the memory bank (BANKi: i=0-15). The I/O circuit 140 includes a write circuit and a read circuit, and can write data into the memory bank (BANKi: i=0-15) and read data from the memory bank (BANKi: i=0-15).

Figure 3:
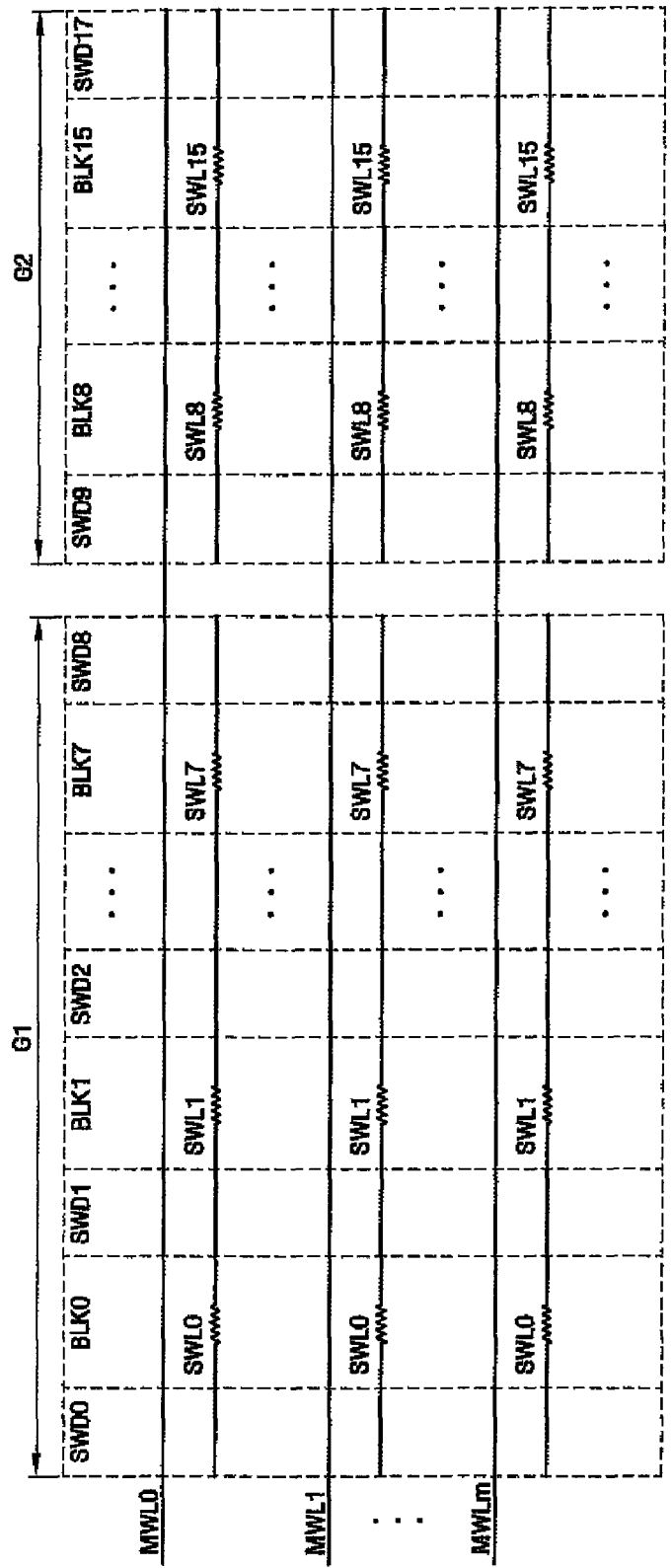
FIG. 3 is a circuit diagram illustrating a nonvolatile memory device, according an exemplary embodiment of the present invention.
Figure 4:
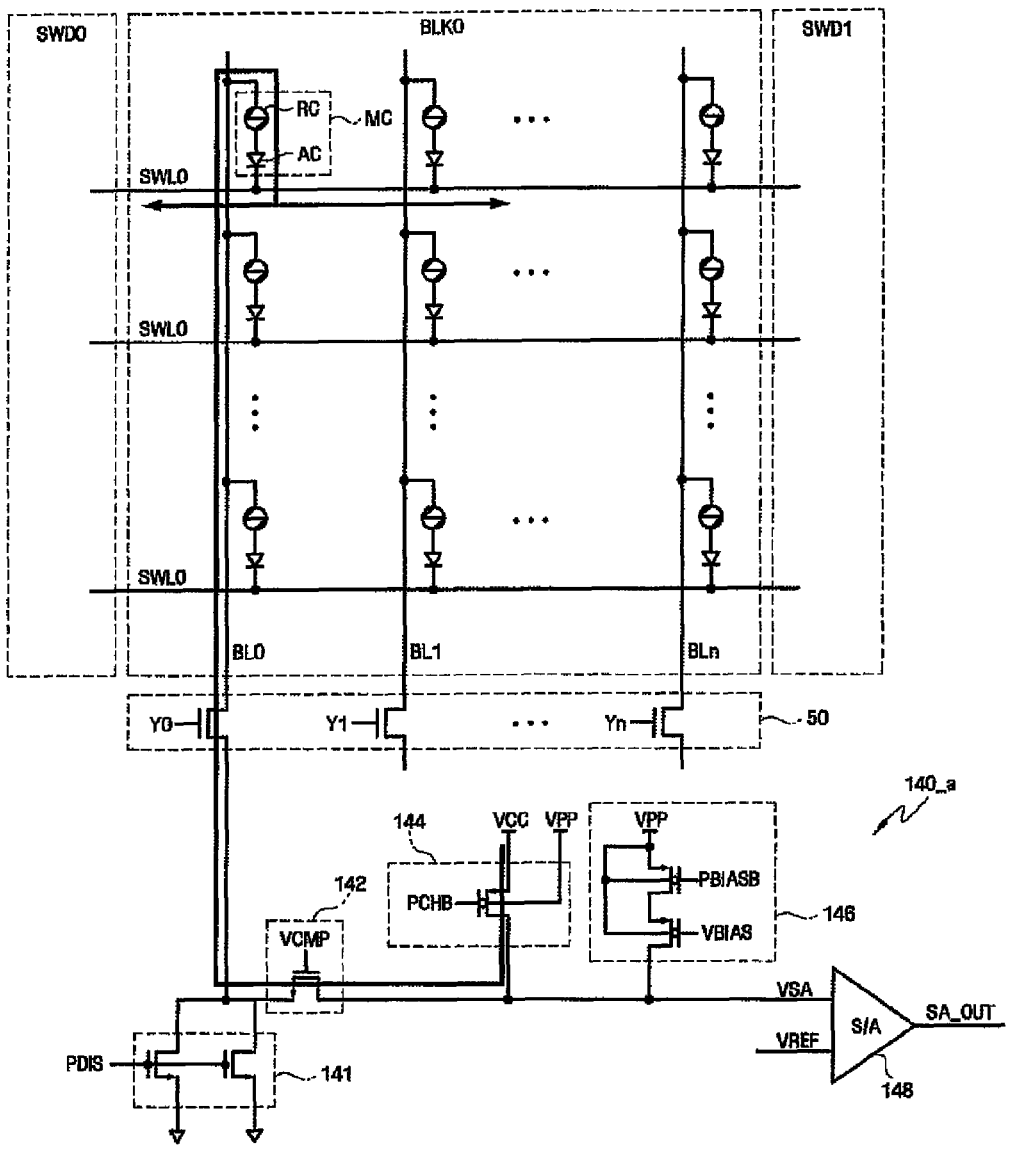
FIG. 4 is a circuit diagram illustrating a memory block shown in FIG. 3, according an exemplary embodiment of the present invention.

FIG. 3 is a representative layout showing a nonvolatile memory device, according an illustrative embodiment of the present invention. FIG. 3 illustrates the first memory sector SECTOR0 shown in FIG. 2, as an example. FIG. 4 is a circuit diagram illustrating the first memory block BLK0 shown in FIG. 3, according to an illustrative embodiment of the present invention.

Referring to FIGS. 3 and 4, the nonvolatile memory device includes multiple memory blocks BLKk: k=0-15, main word lines MWL0-MWLm, sub-word lines SWL0-SWL15, and multiple sub-word line drivers SWD0-SWD17.

The memory blocks BLKk: k=0-15 are separated by corresponding sub-word line drivers SWD0-SWD17. Also, the multiple memory blocks BLKk: k=0-15 are divided into memory block groups G1, G2, where each memory block group G1, G2 includes two or more of the memory blocks BLKk: k=0-15. In FIG. 3, although the memory blocks BLKk: k=0-15 are divided into two memory block groups G1, G2, the various embodiments are not limited to two. For example, in other exemplary embodiments, the multiple memory blocks can be divided among more than two memory block groups.

Each of the memory blocks BLKk: k=0-15 includes a matrix of multiple nonvolatile memory cells MC. A representative memory cell MC is shown in BLK0 in FIG. 4. A row of the multiple nonvolatile memory cells MC is coupled to each main word line MWL0-MWLm, and a column of the multiple nonvolatile memory cells MC is coupled to a bit line BL0-BLn.

As shown in FIG. 4, the nonvolatile memory cell MC may include a variable resistive element RC, including a phase change material that has different resistances according to a crystal state and an amorphous status, and an access element AC, which controls current flow in the variable resistive element RC. The access element AC can be a diode or a transistor, for example, which is coupled to the variable resistive element RC in series. A phase change memory cell that uses a diode as the access device AC, e.g., as shown in FIG. 4, is called diode-controlled phase change memory cell (diode-controlled PRAM cell). Also, the phase change material may be any of a variety materials, including for example two atomic compounds, such as GaSb, InSb, InSe, $Sb_2Te_3$, or GeTe, three atomic compounds, such as GeSbTe, GaSeTe, InSbTe, $SnSb_2Te_4$, or InSbGe, or four atomic compounds, such as AgInSbTe, (GeSn)SbTe, GeSb(SeTe), $Te_{81}Ge_{15}Sb_2S_2$. GeSbTe, which consists of germanium Ge, antimony Sb, and tellurium Te, is commonly used.

The word lines may be implemented in a hierarchical word line structure using the multiple main word lines MWL0-MWLm and multiple sub-word lines SWL0-SWL15. More particularly, each main word line MWL0-MWLm is arranged to be common to multiple memory blocks BLKk: k=0-15. Each sub-word line SWL0-SWL15 is arranged to correspond to each memory block BLKk: k=0-15 and is coupled to the main word line MWL0-MWLm through a corresponding sub-word line driver SWD0-SWD17.

The sub-word line drivers SWD0-SWD17 are coupled between the main word lines MWL0-MWLm and each of the sub-word lines SWL0-SWL15, and respond to signals applied to the main word line MWL0-MWLm to control the levels of the sub-word lines SWL0-SWL15, respectively. For example, the sub-word line drivers SWD0-SWD17 discharge the sub-word lines SWL0-SWL15 when a high level signal is applied to the main word lines MWL0-MWLm, and maintain the sub-word lines SWL0-SWL15 at a certain voltage level higher than a ground voltage when a low level signal is applied to the main word lines MWL0-MWLm.

FIG. 3 illustrates that the sub-word line drivers SWD0-SWD17 are placed on both sides of each of the memory blocks BLKk: k=0-15, and that certain sub-word line drivers (for example, sub-word line drivers SWD0 and SWD8) are placed on each end of corresponding memory block groups (for example, G1). However, it is understood that the sub-word line drivers SWD0-SWD17 are not limited to this configuration. For example, in other exemplary embodiments of the present invention, only one sub-word line driver is placed for each memory block, and the sub-word line driver may be located on one side of the memory block group.

In the nonvolatile memory device according to exemplary embodiments of the present invention, the sub-word lines (for example, SWL0-SWL7) located in the same memory block group (for example, G1) are electrically connected to one another, while the sets of sub-word lines (for example, SWL0-SWL7 and SWL8-SWL15) respectively located in different memory block groups (for example, G1, G2) are electrically isolated from one another. In other words, the sub-word lines SWL0-SWL7 in the first memory block group G1 are electrically connected to one another, and the sub-word lines SWL8-SWL15 in the second memory block G2 are electrically connected to one another, while the sub-word lines SWL0-SWL7 in the first memory block group G1 are electrically isolated from the sub-word lines SWL8-SWL15 in the second memory block G2.

As a result, capacitance between each of the sub-word lines SWL0-SWL15 and the multiple memory blocks BLKk: k=0-15 is relatively small. Thus, due to current I resulting from clamping each bit line BL0-BLn to a certain bias level and precharging and/or due to read current provided by read bias generating circuit 146 of read circuit 140_a during a read operation, increased voltage levels of the sub word lines SWL0-SWL15 can be prevented. Therefore, during a read operation, for example, reading a higher level of resistance than the resistance level stored in a nonvolatile memory cell MC is prevented, which improves performance of the read operation. Additional details are described below with reference to FIGS. 5A through 6.

Also, in the nonvolatile memory device according to exemplary embodiments of the present invention, the sub-word lines SWL0-SWL7, SWL8-SWL15 in each memory block group G1, 62, respectively, are electrically connected within the group and electrically isolated from the sub-word lines in the other group. In comparison, where the sub-word lines SWL0-SWL15 in each of the memory blocks BLKk: k=0-15 are all electrically isolated, the number of the sub-word line drivers corresponding to the sub-word lines SWL0-SWL15 and the layout area can be increased.

Referring to FIG. 4, the bit lines BL0-BLn are selectively coupled to read circuit 140_a of an I/O circuit (e.g., I/O circuit 140 in FIG. 2) through a column selection circuit 50. The column selection circuit 50 may include transistors corresponding to the bit lines BL0-BLn, which are turned on in response to column selection signals Y1-Yn provided by a column decoder (e.g., column decoder 130 in FIG. 2).

The read circuit 140_a is a circuit to read data stored in the nonvolatile memory cells MC selected in the memory blocks BLKk: k=0-15 and may include a discharge circuit 141, a precharge circuit 144, a clamping circuit 142, a read bias generating circuit 146 and a sensing circuit 148, as illustrated in FIG. 4.

Before the read operation, the discharge circuit 141 responds to a discharge signal PDIS and discharges the bit line (for example, BL0) coupled to the selected nonvolatile memory cell and/or a sensing node VSA to a predetermined voltage, for example, ground voltage VSS.

The precharge circuit 144 precharges the sensing node VSA to a predetermined level, for example, a source voltage VCC during the precharge period of the read operation. The precharge circuit 144 may be a PMOS transistor, for example, which receives a precharge signal PCHB through its gate. The substrate region of the PMOS transistor is may be coupled to boost voltage VPP.

The clamping circuit 142 responds to a clamping control signal VCMP and clamps the level of the bit line BL0 to a proper bias level within a proper range for reading. For example, the clamping circuit 142 may clamp to a level below a critical voltage Vth of the phase change materials. When the clamping level is above the critical voltage Vth, the phase of the phase change material of the selected multi-level memory cell MC can change.

The read bias generating circuit 146 responds to a control bias VBIAS and supplies the sensing node VSA with the read bias to read the resistance level of selected nonvolatile memory cell MC. The read bias generating circuit 146 may include first and second PMOS transistors, for example. The first PMOS transistor is coupled to the boost voltage VPP and receives a bias signal PBIASB through its gate. The second PMOS transistor is coupled to the sensing node VSA and receives the control bias VBIAS through its gate. The substrate region where the PMOS transistors are formed may be coupled to the boost voltage VPP.

The sensing circuit 148 compares a level of the sensing node VSA to a reference bias VREF and outputs a comparison result SA_OUT. For example, when the level of the sensing node VSA is higher than the level of the reference bias VREF, a high level of the comparison result SA_OUT is produced. In contrast, when the level of the sensing node VSA is lower than the level of the reference bias VREF, a low level of the comparison result SA_OUT is produced.

Hereinafter, operations of nonvolatile memory devices according to exemplary embodiments of the present invention are described with reference to FIGS. 4 through 6.

Figure 5A:
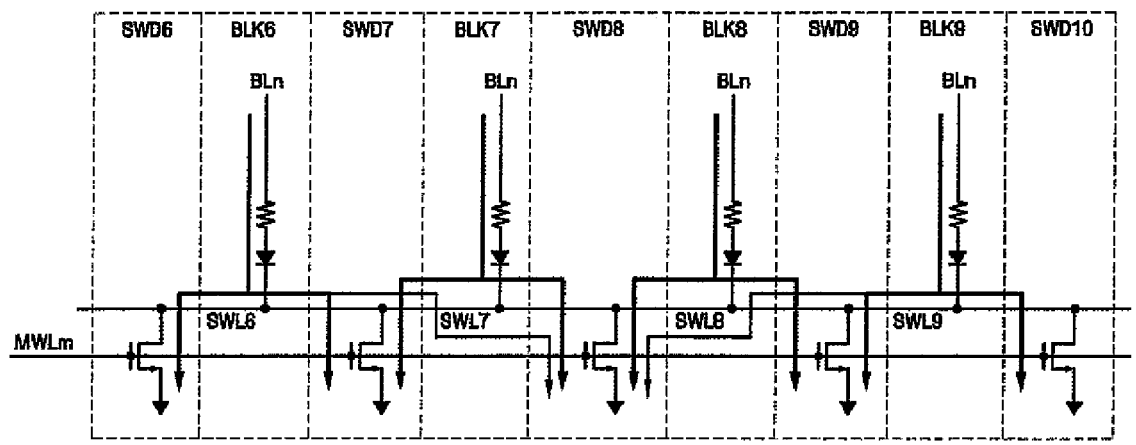
FIG. 5A is a circuit diagram illustrating read operations of a conventional nonvolatile memory device.
Figure 5B:
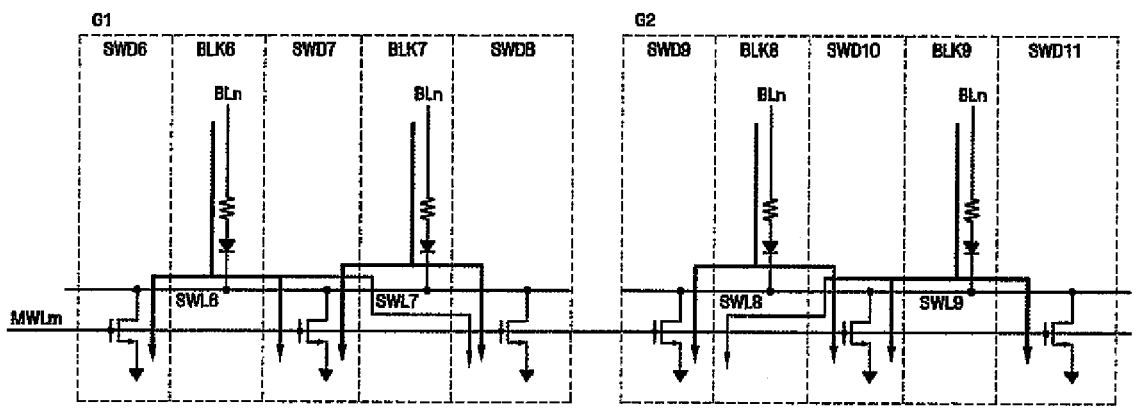
FIG. 5B is a circuit diagram illustrating read operations of a nonvolatile memory device, according an exemplary embodiment of the present invention.

FIG. 5A is a circuit diagram illustrating read operations of a conventional nonvolatile memory device. FIG. 5B is a circuit diagram illustrating read operations of the nonvolatile memory device according to exemplary embodiments of the present invention. For purposes of explanation and to assist understanding, FIGS. 5A and 5B depict only pull-down devices used as sub-word line drivers and sub-word lines SWL6-SWL-9 of all sub-word lines SWL0-SWL15. However, as discussed below, the various embodiments are not limited to use of pull-down devices, and at least one pull-up device may be included among the multiple sub-word line drivers. Likewise, FIGS. 5A and 5B illustrate that current provided by memory blocks BLK7 and BLK8 does not flow through sub-word lines SWL6 and SWL9, respectively. However, not showing the current flowing through sub-word lines SWL6 and SWL9 is intended to illustrate that relatively more current flows through the sub-word line where more memory blocks are placed in the surrounding area.

Figure 6:
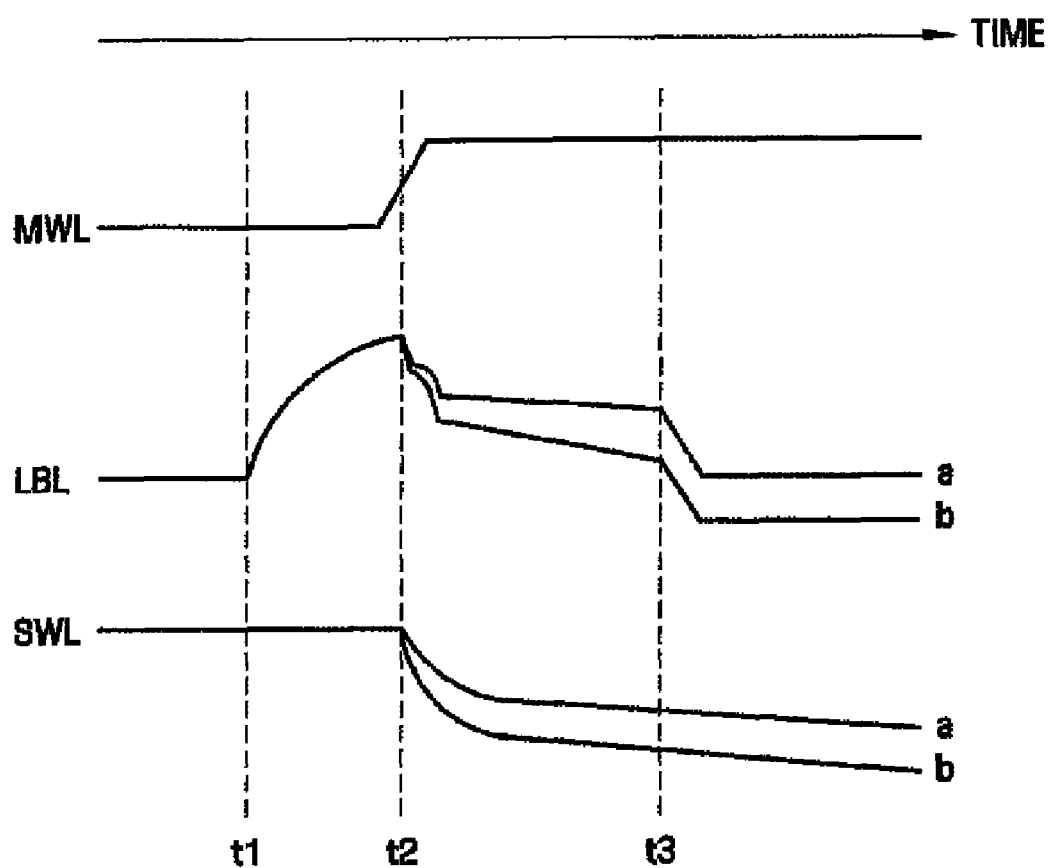
FIG. 6 is a timing diagram illustrating operations of a nonvolatile memory device, according to exemplary embodiments of the present invention.

FIG. 6 is a timing diagram illustrating operations of a nonvolatile memory device, according to exemplary embodiments of the present invention. Curve a in FIG. 6 illustrates a case in which all sub-word lines are electrically connected, and curve b in FIG. 6 illustrates a case in which all sub-word lines are not electrically connected, for example, as shown in FIG. 5B.

Referring to FIGS. 4 and 6, during a read operation, bit lines BL0-BLn are clamped to a bias level by clamping circuit 142 and precharged by precharge circuit 144 of read circuit 140_a during time period t1-t2. During time period t2-t3, sub-word lines SWL0-SWL15 respond to a high level signal provided by main word line MWLm, and are coupled to ground voltage to discharge. Sensing circuit 148 compares a level of sensing node VSA, which changes due to discharge, to a level of reference bias VREF and produces comparison result SA_OUT.

Referring to representative bit line BL0 for purposes of explanation, when the bit line BL0 is clamped to a certain bias level and precharged, a resistance level of a variable resistive element RC of nonvolatile memory cell MC coupled to the bit line BL0 can be different from resistance levels of variable resistive elements RC of nonvolatile memory cells MC coupled to other bit lines BL1-BLn. As a result, current can flow through sub-word lines SWL0-SWL15 and into ground, and the voltage level of the sub-word lines SWL0-SWL15 can be increased.

Generally speaking, when threshold voltage Vth of the access element AC of each nonvolatile memory cell MC is 0.8 V and the variable resistive element RC has a resistance of 1 MΩ, for example, current may not flow in the bit line BL0 when clamped to 1.3 V, due to the voltage drop by the variable resistive element RC and the threshold voltage of the access element AC. In contrast, when the bit line BL0 coupled to the variable resistive element RC having a resistance of 50 KΩ, for example, current may flow through the sub-word line (for example, SWL0-SWL7), since voltage drop by the variable resistive element RC is not particularly large. Thus, the voltage level of the sub-word line coupled to the variable resistive element RC having a resistance of 50 KΩ is increased compared to the voltage level of the sub-word line coupled to the variable resistive element RC having a resistance of 1 MΩ, and a value larger than the resistance level stored in the nonvolatile memory cell MC can be read. Since for the resistance level of set resistance, a value larger than the stored resistance level can be read, the sensing margin is reduced and an error can occur during read operation.

More specifically, referring to FIG. 5A, in the memory blocks BLKk: k=0-15 having a main word line in common (for example, MWLm), when all the sub-word lines SWL6-SWL9, which correspond to respective memory blocks BLKk: k=0-15, are electrically connected, the capacitance between each of the sub-word lines SWL6-SWL9 and the memory blocks BLKk: k=0-15 can be relatively large depending on the locations of the sub-word lines SWL6-SWL9. An error may therefore occur during a read operation. That is, during the read operation, since each of the sub-word lines SWL6-SWL9 is coupled to the ground voltage and current can flow from the bit line BLn in the memory blocks BLKk: k=0-15 to the sub-word lines SWL6-SWL9, a value larger than the resistance levels stored in the corresponding nonvolatile memory cells MC can be read erroneously due to capacitance between the sub-word lines SWL6-SWL9 and the respective memory blocks BLKk: k=0-15 being relatively large.

In other words, referring to FIG. 5A, during a read operation, current I, provided after clamping the bit line BLn to a certain bias level and precharging, and/or read current, provided by a read bias generating circuit flows through the sub-word lines SWL6-SWL9 into ground of the corresponding sub-word line drivers SWD6-SWD10. However, for a sub-word line driver (for example, SWD8) having many memory blocks BLKk: k=0-15 located nearby, a larger amount of current can flow to ground as compared to a sub-word line driver (for example, SWD6, SWD10) having fewer memory blocks BLKk: k=0-15 are located nearby. Thus, the voltage level of a sub-word line coupled to other memory blocks (for example, SWL7, SWL8) can be relatively higher than the voltage level of a sub-word line (for example, SWL6, SWL9) which is not coupled. Also, as the voltage level of the sub-word line (for example, SWL7, SWL8) increases, the voltage level of the sensing node VSA likewise increases. As a result, during a read operation, a value higher than the resistance level stored in a corresponding nonvolatile memory cell MC can be read, and an error can occur.

However, as illustrated in FIG. 5B, in the nonvolatile memory device according to exemplary embodiments of the present invention, the sub-word lines SWL6-SWL7, SWL8-SWL9, located within the same memory block group G1, G2, respectively, are electrically connected to one another, whereas the sub-word lines SWL6-SWL7, SWL8-SWL9, located in separate memory block groups G1, G2, are electrically isolated from one another. Thus, in the multiple memory blocks BLKk: k=0-15, having a common main word line MWLm, all the sub-word lines SWL6-SWL9 which are respectively located with memory blocks BLKk: k=0-15 are not all electrically connected. As a result, the capacitance between each of the sub-word lines SWL6-SWL9 and the respective memory blocks BLKk: k=0-15 is relatively small.

More specifically, since a sub-word line (for example, SWL7) of the first memory block G1 and a sub-word line (for example, SWL8) of the second memory block G2 are electrically isolated from one another, a large amount of current does not flow through a sub-word line driver (for example, SWD8) to ground, even though the sub-word line driver (for example, SWD8) has relatively many memory blocks BLKk: k=0-15 located nearby. Thus, the current provided by memory blocks (for example, BLK8, BLK9) of the second memory block G2 does not flow through the sub-word line driver (for example, SWD8) of the first memory block G1 to ground.

Thus, as illustrated in FIG. 5B, an increase of voltage level of the sub-word lines SWL6-SWL9, e.g., due to current provided after clamping the bit line BLn to a certain bias level and precharging and/or due to the read current provided by read bias generating circuit 146, can be prevented, as compared to the configuration illustrated in FIG. 5A, in which all sub-word lines SWL6-SWL9 are electrically connected. The comparison is depicted graphically in FIG. 6, which shows curve a (corresponding to FIG. 5A) having higher voltage levels than curve b (corresponding to FIG. 5B). Therefore, during a read operation, reading a resistance level higher than the resistance level stored in the nonvolatile memory cell MC is prevented, and errors can be reduced during the read operation.

Figure 7:
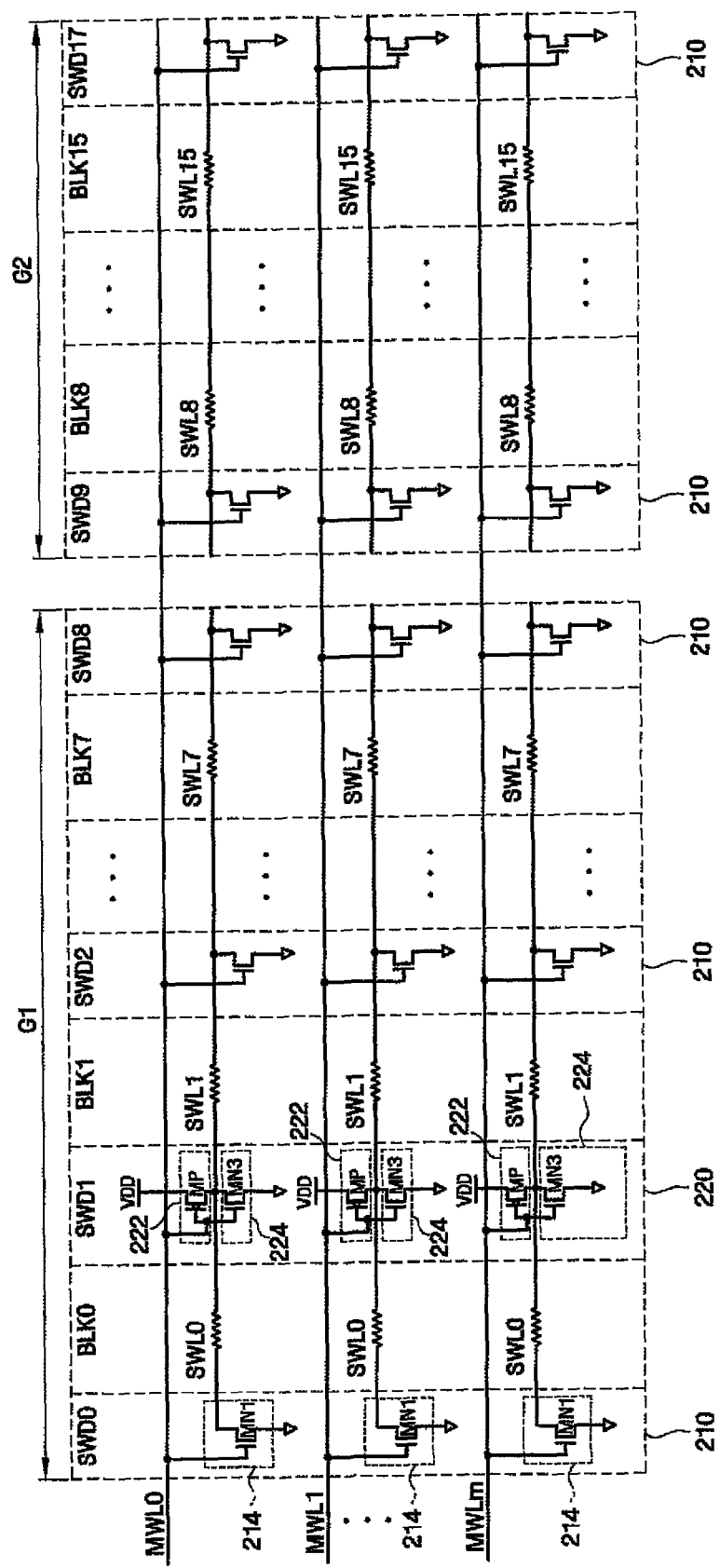
FIG. 7 is a circuit diagram illustrating a nonvolatile memory device, according to an exemplary embodiment of the present invention.

FIG. 7 is a circuit diagram illustrating a nonvolatile memory device, according to an exemplary embodiment of the present invention. FIG. 7 is an example of the layout shown in FIG. 3 in more detail.

Referring to FIG. 7, a nonvolatile memory device includes multiple memory blocks BLKk: k=0-15, main word lines MWL0-MWLm, sub-word lines SWL0-SWL15, and multiple sub-word line drivers SWD0-SWD17.

The multiple memory blocks BLKk: k=0-15 are divided into memory block groups G1, G2. Each memory block group G1, G2 includes two or more memory blocks BLKk: k=0-15. Also, each main word line MWL0-MWLm is used in common by the multiple memory blocks BLKk: k=0-15, while each sub-word line SWL0-SWL15 is respectively located in one of the memory block groups G1, G2.

Accordingly, sub-word lines (for example, SWL0-SWL7) located in the same memory block group (for example, G1) are electrically connected to one another, whereas sub-word lines (for example, SWL7, SWL8) located in separate memory block groups (for example, G1, G2) are electrically isolated from one another. Therefore, the capacitance between each sub-word line SWL0-SWL15 and the respective memory blocks BLKk: k=0-15 is relatively small. Thus, during a read operation, reading a higher level of resistance than the resistance level stored in a nonvolatile memory cell MC is prevented, improving performance during the read operation. Also, the layout is more efficient than a layout in which all sub-word lines SWL0-SWL15 are electrically isolated from one another.

Each sub-word line SWL0-SWL15 is coupled to a main word line MWL0-MWLm through at least one corresponding sub-word line driver SWD0-SWD17. More particularly, sub-word line drivers SWD0-SWD17 are located on both sides of each memory block BLKk: k=0-15, such that a sub-word line driver is placed at both sides of each memory block group. For example, sub-word line drivers SWD0 and SWD8 are positioned on both sides of memory block group G1 and sub-word line drivers SWD9 and SWD17 are positioned on both sides of memory block group G2.

Each of the sub-word line drivers SWD0-SWD17 includes at least one of a first sub-word line driver 210 and a second sub-word line driver 220. As illustrated in FIG. 7, for example, the first sub-word line drivers 210 and the second sub-word line drivers 220 may be arranged alternately. However, the various embodiments are not limited to this configuration, and in other exemplary embodiments, the first sub-word line drivers 210 and the second sub-word line drivers 220 may be arranged in various fashions. For example, a second sub-word line driver 220 may be located in the middle of each memory block group, and first sub-word line drivers 210 may be located in other positions.

In the depicted embodiment, the first sub-word line driver 210 does not include a pull-up device. Rather, the first sub-word line driver 210 includes a pull-down device 214 that pulls down the voltage level of the respective sub-word line (for example, SWL0) by responding to voltages applied to the main word lines MWL0-MWLm.

In an embodiment the pull-down device 214 of the first sub-word line driver 210 may include a first NMOS transistor MN1, for example, connected between the respective sub-word line (for example, SWL0) and ground voltage VSS. A gate of the first NMOS transistor MN1 is configured to receive a signal from the main word line (for example, MWL0), in order to turn on/off the first NMOS transistor MN1.

The second sub-word line driver 220 includes a pull-up device 222, which pulls up the voltage level of the respective sub-word line (for example, SWL1) in response to a signal applied to the main word line (for example, MWL0). The second sub-word line driver 220 also includes a pull-down device 224, which pulls down the voltage level of the respective sub-word line (for example, SWL1) in response to the signal applied to the main word line (for example, MWL0).

In an embodiment, the pull-up device 222 of the second sub-word line driver 220 may include a PMOS transistor MP, for example, connected between source voltage VDD and the respective sub-word line (for example, SWL1), and the pull-down device 224 may include a second NMOS transistor MN3, for example, connected between the respective sub-word line (for example, SWL1) and the ground voltage VSS. The gates of the PMOS transistor MP and the second NMOS transistor MN3 may be configured to receive a signal from the main word line (for example, MWL0), in order to turn on/off the PMOS transistor MP and the second NMOS transistor MN3.

Accordingly, the first and second sub-word line drivers 210 and 220 provide the nonvolatile memory cell MC selected during read (or write) operations with current path. In particular, the pull-down devices 214, 224 of first and second sub-word line drivers 210 and 220 are turned on by responding to the signals applied to the main word lines MWL0-MWLm, and form current paths such that the current that flows through the respective nonvolatile memory cell MC may exit to the ground voltage VSS. The pull-up device 222 of the second sub-word line driver 220 turns on when the nonvolatile memory device is inactive (for example, during a standby period) and maintains the voltage level of the respective sub-word line (for example, sub-word line SWL1) to a predetermined level.

Although FIG. 7 illustrates a first sub-word line driver 210 that includes only a pull-down device and a second sub-word line driver 220 that includes pull-down and pull-up devices, the nonvolatile memory device and/or the sub-word line drivers are not limited to this configuration. For example, in various embodiments of the present invention, all sub-word line drivers may include pull-down device and pull-up devices.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device comprising:
   a plurality of memory blocks divided into a plurality of memory block groups, each memory block group comprising at least two memory blocks of the plurality of memory blocks;
   a main word line common to the plurality of memory blocks;
   a plurality of sub-word lines corresponding to the plurality of memory blocks;
   a plurality of sub-word line drivers coupled between the main word line and each sub-word line, each sub-word line driver responding to a signal applied to the main word line and controlling a level of a corresponding sub-word line,
   wherein sub-word lines of the plurality of sub-word lines located within the same memory block group of the plurality of memory block groups are electrically connected and sub-word lines of the plurality of sub-word lines located in different memory block groups of the plurality of memory block groups are electrically isolated from each other, and
   wherein the plurality of sub-word lines are discharged when the signal applied to the main word line is a first level and the plurality of sub-word lines are maintained with a fixed level higher than ground voltage when the signal applied to the main word line is a second level.

2. A nonvolatile memory device comprising:
   a plurality of memory blocks divided into a plurality of memory block groups, each memory block group comprising at least two memory blocks of the plurality of memory blocks;
   a main word line common to the plurality of memory blocks;
   a plurality of sub-word lines corresponding to the plurality of memory blocks; and
   a plurality of sub-word line drivers coupled between the main word line and the plurality of sub-word lines, respectively, each sub-word line driver responding to a signal applied to the main word line and controlling a level of a corresponding sub- word line,
   wherein sub-word lines of the plurality of sub-word lines located within the same memory block group of the plurality of memory block groups are electrically connected and sub-word lines of the plurality of sub-word lines located in different memory block groups of the plurality of memory block groups are electrically isolated from each other, and wherein a sub-word line driver of the plurality of sub-word line drivers is placed at each end of each memory block group.

3. The nonvolatile memory device of claim 2, wherein at least one sub-word line driver of the plurality of sub-word line drivers is located adjacent to each of the memory blocks, respectively.

4. The nonvolatile memory device of claim 2, wherein each sub-word line driver comprises one of a first sub-word line driver and a second sub-word line driver, wherein the first sub-word line driver includes a pull-down device that pulls down the level of the corresponding sub-word line, and wherein the second sub-word line driver includes a pull-up device that pulls up the level of the corresponding sub-word line and a pull-down device that pulls down the level of the corresponding sub-word line, in response to the signal applied to the main word line.

5. The nonvolatile memory device of claim 2, wherein each of the plurality of memory blocks comprises a matrix of nonvolatile memory cells, each of the plurality of sub-word lines being coupled to a row of nonvolatile memory cells in the matrix of nonvolatile memory cells.

6. The nonvolatile memory device of claim 5, further comprising:
a bit line coupled to a column of nonvolatile memory cells; and
a clamping circuit coupled to the bit line and clamps a voltage level applied to the bit line to a fixed level.

7. The nonvolatile memory device of claim 5, wherein a resistance level of each of the nonvolatile memory cells varies depending on data stored in the nonvolatile memory cell.

8. The nonvolatile memory device of claim 7, wherein the nonvolatile memory cells comprise diode-controlled phase change ram (PRAM) cells.

9. A nonvolatile memory device comprising:
a plurality of memory blocks divided into a plurality of memory block groups, each memory block group comprising at least two memory blocks of the plurality of memory blocks;
a main word line commonly located in the plurality of memory blocks;
a plurality of sub-word lines respectively corresponding to the plurality of memory blocks;
a first sub-word line driver for driving a first sub-word line of the plurality of sub-word lines; and
a second sub-word line driver, different from the first sub-word line driver, for driving a second sub-word line of the plurality of sub-word lines, the first and second sub-word line drivers being respectively located on each side of at least one memory block of the plurality of memory blocks, wherein sub-word lines of the plurality of sub-word lines located within the same memory block group are electrically connected to each other, and sub-word lines of the plurality of sub-word lines not located in the same memory block group are electrically isolated from each other, and wherein the first sub-word line driver includes a pull-down device, which pulls down a level of the first sub-word line in response to a signal applied to the main word line, and which does not include a pull-up device, and the second sub-word line driver includes a pull-up device, which pulls up a level of the second sub-word line in response to the signal applied to the main word line, and a pull-down device, which pulls down the level of the second sub-word line in response to the signal applied to the main word line.

10. The nonvolatile memory device of claim 9, wherein the first and second sub-word line drivers respectively discharge the first and second sub-word lines when the signal applied to the main word line comprises a first level, and the first and second sub-word line drivers respectively maintain the first and second sub-word lines at a fixed level higher than ground voltage when the signal applied to the main word line comprises a second level.

11. The nonvolatile memory device of claim 9, wherein each of the plurality of memory blocks comprises a matrix of nonvolatile memory cells, and each of the plurality of sub-word lines is coupled to a row of the matrix of nonvolatile memory cells.

12. The nonvolatile memory device of claim 11, further comprising:
a bit line coupled to a column of the matrix of nonvolatile memory cells; and
a clamping circuit coupled to the bit line, the clamping circuit clamping a voltage level applied to the bit line to a fixed level.

13. The nonvolatile memory device of claim 11, wherein the nonvolatile memory cells comprise diode-controlled phase change ram (PRAM) cells.

* * * * *